(12) United States Patent
Bryan-Brown et al.

(10) Patent No.: US 9,034,429 B2
(45) Date of Patent: May 19, 2015

(54) METHOD FOR PATTERNING A SURFACE USING SELECTIVE ADHESION

(75) Inventors: Guy Peter Bryan-Brown, Worcestershire (GB); David Walker, Worcestershire (GB); John Clifford Jones, Worcestershire (GB)

(73) Assignee: ZBD DISPLAYS LIMITED, Worcester (GB)

( * ) Notice: Subject to any disclaimer, the term of this patent is extended or adjusted under 35 U.S.C. 154(b) by 986 days.

(21) Appl. No.: 12/736,897

(22) PCT Filed: May 19, 2009

(86) PCT No.: PCT/GB2009/050538
§ 371 (c)(1),
(2), (4) Date: Jan. 12, 2011

(87) PCT Pub. No.: WO2009/141648
PCT Pub. Date: Nov. 26, 2009

(65) Prior Publication Data
US 2011/0104389 A1    May 5, 2011

Related U.S. Application Data

(60) Provisional application No. 61/071,800, filed on May 19, 2008.

(30) Foreign Application Priority Data

May 19, 2008   (GB) .................................. 0809062.3

(51) Int. Cl.
*B05D 1/36*      (2006.01)
*G02F 1/1337*    (2006.01)
(Continued)

(52) U.S. Cl.
CPC ............. *G02F 1/13378* (2013.01); *B82Y 10/00* (2013.01); *B82Y 40/00* (2013.01); *G02F 1/1391* (2013.01); *G02F 2001/133761* (2013.01); *G02F 2202/28* (2013.01); *G03F 7/0002* (2013.01)

(58) Field of Classification Search
USPC .................................. 427/510, 258, 264, 301
See application file for complete search history.

(56) References Cited

U.S. PATENT DOCUMENTS

| 4,284,703 A | 8/1981 | Inoue et al. |
| 4,751,167 A | 6/1988 | Ohsawa et al. |

(Continued)

FOREIGN PATENT DOCUMENTS

| EP | 1 362 682 | 11/2003 |
| TW | 379395 | 1/2000 |

OTHER PUBLICATIONS

International Search Report for PCT/GB2009/050538, mailed Jul. 27, 2009.

(Continued)

*Primary Examiner* — Robert S Walters, Jr.
(74) *Attorney, Agent, or Firm* — Nixon & Vanderhye P.C.

(57) ABSTRACT

The invention relates to a method of patterning a layer formed from a fixable material such as photopolymer on a surface in a desired pattern. The method involves coating selected areas of the substrate with an adhesion promoter and subsequently coating the fixable material. The fixable material is then fixed, for instance by curing by exposure to UV radiation. The adhesion promoter is adapted to have a surface energy which is designed to adhere to the substrate or selected areas thereof and also to the fixed material such that fixed material may be easily removed from areas of the substrate not coated with adhesion promoter but retained in areas where the adhesion promoter has bonded to the substrate.

20 Claims, 11 Drawing Sheets

(51) Int. Cl.
*B82Y 10/00* (2011.01)
*B82Y 40/00* (2011.01)
*G03F 7/00* (2006.01)
*G02F 1/139* (2006.01)

(56) References Cited

U.S. PATENT DOCUMENTS

| | | | |
|---|---|---|---|
| 5,296,333 A | 3/1994 | Lamarre | |
| 6,013,409 A | 1/2000 | Chou | |
| 6,565,927 B1* | 5/2003 | Drzal et al. | 427/487 |
| 2005/0150589 A1* | 7/2005 | Amos et al. | 156/209 |
| 2005/0153107 A1* | 7/2005 | Iijima | 428/195.1 |
| 2006/0105116 A1 | 5/2006 | Kim et al. | |
| 2007/0246441 A1 | 10/2007 | Kim et al. | |
| 2008/0012184 A1 | 1/2008 | Chou | |

OTHER PUBLICATIONS

Written Opinion of the International Searching Authority for PCT/GB2009/050538, Mailed Jul. 27, 2009.

Great Britain Search Report for 0809062.3, searched Aug. 3, 2008.

English translation of Taiwanese Office Action dated Apr. 21, 2014 in TW 098116605.

* cited by examiner

1.

2.

3.

4.

METHOD FOR PATTERNING A SURFACE USING SELECTIVE ADHESION

This application is the U.S. national phase of International Application No. PCT/GB2009/050538, filed 19 May 2009 which designated the US and claims priority to United Kingdom Application No. 0809062.3, filed 19 May 2008 and U.S. Application No. 61/071,800, filed 19 May 2008, the entire contents of each of which are hereby incorporated by reference.

This invention relates to a method of providing a patterned surface for use in a liquid crystal display device or spatial light modulator, such as an alignment layer. In particular the method relates to forming a layer from a fixable material, such as a photopolymer or thermo-setting polymer, coated onto a substrate.

Liquid crystal devices (LCDs) and spatial light modulators typically comprise a thin layer of liquid crystal material contained between a pair of cell walls spaced between 2 μm and 10 μm apart. The substrates used to form the cell walls are usually formed from glass (such as a 0.7 mm soda-lime glass) or from a flexible plastic layer (such as PET, PES or PEN). The substrates will include electrode structures on the internal surfaces, often formed in transparent conductors such as ITO or PEDOT. On one or both of the substrates, the electrodes will be patterned to form the appropriate pixel structures. In a passive matrix device, row and column electrodes are on opposite internal surfaces of the device. Each pixel is formed at the cross section of the electrodes. Alternatively, active matrix devices have a common electrode for one substrate and each pixel is addressed from bus lines on the other substrate, with thin-film transistor or similar arrangements used to eliminate cross talk from the bus lines.

It is usual in LCDs that the uppermost internal layer of each substrate is treated with an appropriate alignment layer. This layer is designed to impart the appropriate alignment of the symmetry axis for the liquid crystal molecules in contact with it. The bulk of the liquid crystal then adopts a configuration that depends on the surface alignment properties of the cell walls and on various other factors, such as the type of liquid crystal material and the thickness of the liquid crystal layer. The electrodes enable the application of an electric field to the liquid crystal layer. This causes re-orientation of the liquid crystal to align either parallel or perpendicular to the applied field, according to the design, thereby modulating the structure of the liquid crystal. Means is usually provided for distinguishing between the different alignment configurations (e.g. the surface aligned and field aligned states). These include illuminators, polarisers, reflectors, scatterers and diffusers, colour filters and retardation plates. For example, the device may include micro-prism refractors designed to give the appropriate viewing properties, such as improved brightness in a particular direction.

There are many different types of alignment available to those skilled in the art. Examples include homeotropic alignment (in which the LC director is normal to the aligning surface, resulting from either low energy surfaces or surfaces with long chain pendant groups, planar homogeneous in which the LC is parallel to the surface and aligned in a preferred direction, and tilted homogenous in which the director is aligned in a preferred direction parallel to the surface but with a fixed tilt angle from that surface. Each type of alignment is achieved using with an appropriate method. For example, many LCDs use a polyimide coating that is spin-coated or pad-printed onto the substrates, baked and then rubbed with a nylon cloth to impart the alignment direction. Alternatively, polyimides with long pendant aliphatic chains are used to give homeotropic alignment.

One type of alignment layer is formed from a grating. Such a grating may be formed from a profiled surface, wherein the alignment is dictated by the combined effect of the local molecular forces of the contacting surface and the shape of that profiled surface. For a uniform alignment the grating would be formed from a periodic or near periodic structure. Where non-uniform structures are required the grating structure (e.g. its shape, direction or alignment properties) may be varied. Alternatively, the grating may be designed to give uniform alignment, but with some property (such as the operating voltage) varying locally. Grating alignment layers are not necessarily formed from profiled surfaces. A flat surface with a locally varying alignment condition (e.g. homeotropic to planar) may also be employed as a grating alignment layer.

One advantage of using a grating alignment layer such as this is that a high degree of flexibility and control is possible. For example, any pretilt can be accessed with a high degree of accuracy and uniformity; varying the liquid crystal alignment direction can be done automatically using domains with different grating direction within the same alignment layer. Another example of the control that grating surfaces allow is the introduction of more than one stable alignment states. One particular type of known multi-stable liquid crystal device is the Zenithal Bistable Device (ZBD) described in patents U.S. Pat. No. 6,249,332 and U.S. Pat. No. 6,456,348. In this device a periodic grating profile is formed on the internal surface of one bounding cell wall. The grating profile is designed to permit the liquid crystal in the device to be electrically latched between any one of two stable, and optically distinguishable, configurations. It is also known that multi-stability can be obtained by provision of a suitable grating profile; e.g. see U.S. Pat. No. 7,053,975.

Aperiodic grating structures have also been shown to provide zenithal bistability; for example see WO01/40853. Zenithal bistability may also be induced using bi-grating structures, as also described in EP1234207, and in EP1139151. Azimuthal bistable devices (ABD) fabricated using grating structures are also known (see EP0744041), as are various surface structures that can be used to provide vertically aligned nematic devices (e.g. see Koike et al, 1997, IDW, p 159-162). Bigrating devices have also been described previously (e.g. EP0744042) as have bistable twisted nematic devices. In addition to mono-gratings and bi-gratings, alignment layers have been described that have multitude of different pitches, amplitudes or other such shape differences formed into a grid arrangement in US2008/0170018A1. Also, grating alignment layers in which the grating structure is broken regularly, randomly or pseudo randomly, by phase shifts, holes or other discontinuous structures WO2004/070465A1. Bistable cholesteric and ferroelectric liquid crystal devices (including such devices having polymer walls as described in GB2315900) are also known. In addition, there are numerous monostable LCDs for which surface relief structures can be used for alignment. For example optically controlled birefringence (OCB or "Pi cells"), vertically aligned nematic (VAN), hybrid aligned nematic (HAN), twisted nematic (TN) and super twisted nematic (STN).

In certain prior art devices, the periodic grating profile required for liquid crystal alignment is etched in a layer of material. For example, a layer of photo-resist material on a glass substrate can be exposed to a pattern of light of a periodically varying intensity. The photo-resist is then developed to provide the desired periodic grating profile.

Alternatively, it is also known to use embossing techniques to stamp a surface profile into a layer of plastic. For example, standard hot foil embossing or stamping techniques have been used to produce grating profile structures in plastic that are suitable for use as liquid crystal alignment layers (e.g. Lee et al, Jpn. J. Appl. Phys. Vol. 32 (1993) pp. L1436-L1438). Various alternative embossing techniques are also known and have been used to form optical storage media (e.g. U.S. Pat. No. 4,790,893) and diffraction-refraction high gloss papers (e.g. U.S. Pat. No. 6,358,442). The preferred method for fabricating the grating alignment layer is to use emboss into a photopolymer, as described in US2005/0150589. The uncured photopolymer is deposited onto the substrate and pressed into close contact with a layer into which the inverse of the required grating has been preformed. This inverse layer maybe made from nickel, or be a plastic casting with the required shape. For example, the layer may be formed from a PET backing film onto which a layer of lacquer material (e.g. also a photopolymer or resin) has the inverse grating formed in it. This type of embossing gives good replication of the alignment grating, with the required uniformity of alignment and applied electric field.

It is common to use some patterning method so that the alignment layer covers the areas of the device to be viewed and switched, but also to ensure that other regions of the device are devoid of the alignment layer. This is done for a number of reasons. Commercial liquid crystal devices are fabricated using two large substrates laminated together, sealed and then cut into sections to form several separate devices. This allows far higher yields to be achieved, with the yield being related to the number of devices per laminate. It is usual for six or more devices to be produced from a single laminate. To form this laminate the UV or thermal seal used to contain the liquid crystal material is first printed onto one of the substrates and the substrates brought together under pressure and the sealant material is then hardened (through the action of heat, time and/or UV). The separate devices are cut from the substrate, ensuring that there is one or more bonding ledge to allow electrical contact to be made the electrodes as required. The device may then be capillary filled with the liquid crystal, tested and electronic drivers attached to the exposed electrodes on the bonding ledge or ledges. Thus, a very important reason for patterning the alignment layer and similar layers (such as hard-coat material applied over the electrodes) is to ensure that the alignment layer is removed from the bonding ledge to ensure good electrical contact is readily made to the electrodes. Also, the alignment layer cannot overlap with the area of the sealant, thereby causing weakening of the seal and potential failure of the device.

Alternatively, devices are known wherein the alignment layer is removed from some regions of the device to allow the alignment from a second layer to become the contacting layer with the liquid crystal. For example, rather than using a simple grating alignment, a device with improved viewing angle can be fabricated using with a rubbed polymer alignment layer that is patterned to give two different alignment directions by covering regions of the rubbed polymer, rubbing in a second direction, and then removing the protective covering from the first regions for which the preferred alignment direction remains unchanged.

There are three common methods used to pattern layers for display devices. The first uses selective removal. A layer (such as the alignment layer) is spin-coated or printed over the whole or majority of the substrate plate. The areas where the layer is needed to be retained are then covered with a screening layer and the remaining areas etched away. This is a common technique used in the display industry, and is usually used for patterning the ITO electrodes, wherein the screening layer is formed using a photo-resist layer that is insensitive to an acid etch. It is possible to use this type of technique for alignment layers also (for example in multi-domain devices described earlier).

A second common method of pattering is to use selective curing. It would be the standard method used for most LCD patterning processes using photoresist, photopolymer or other photo-fixable materials. This is similar to standard photolithographic methods (see for example W. M. Moreau (1988) "Semiconductor Lithography; Principles Practices and Materials", Plenum). Selective cure has been used to manufacture grating alignment layers US2006/0035086 in the prior art and would be the method used for other photopolymers used within a display device (for example photopolymers used in K. R. Amundson and M Srinivasarao (1998) "Liquid crystal anchoring transitions at surfaces creased by polymerization induced phase separation" Phys. Rev E., Vol. 58, p R1211-4, and references therein, P. M. S. Roberts, G. R. Mitchell and F. J. Davis (1997), J. de Phys., II vol 7, 1337-1351, or other homeotropic photopolymers used in WO 02/44801). In this method, the alignment layer is formed from a photopolymer, or photo-resist that is coated over the whole surface of the substrate, for example using an embossing method, screen printing or by spin-coating. Once ready for curing, a pre-patterned mask (e.g. of chrome) is brought into contact or near contact with the surface. The material is then cured through the mask using a collimated UV light source. The substrate is then rinsed with an appropriate solvent, detergent or agitating liquid. For a positive photopolymer, the cured photopolymer will be retained where the mask was transparent to the UV radiation, and the areas that were screened from that radiation will be washed away.

Modifications to the selective cure method that use a 'dry film' process have been described in U.S. Pat. No. 4,751,167 (Yamagata) and U.S. Pat. No. 6,013,409 (Chou). These are special cases of the selective cure process in which the photopolymer layer is effectively solid at room temperature by virtue of high molecular weight. In both cases, the carrier film is laminated onto the receiving substrate under heat and pressure followed by a masked exposure after which the carrier film is peeled. Upon peeling, the photoactivated regions of the photopolymer are retained on the receiving substrate while the non photoactivated (but still solid) regions are retained on the carrier film. These dry transfer processes do not require the subsequent rinsing of uncured material from the receiving substrate. However these processes are limited to the regime of high photopolymer viscosity which makes them unsuitable for applications in which the photopolymer is required to flow into a microscopic high aspect ratio grating structure at a speed and pressure, such as an embossing or UV casting type of approach. This makes them impractical for high throughput manufacturing.

The methods have the important disadvantage that they require accurate alignment of a mask to create the pattern, require expensive equipment (such as collimated UV sources), and have a relatively large number of steps. They usually also require a number of additional steps, including the rinsing of the uncured material and require expensive equipment that are not suited to low-cost in-line manufacturing (such as the collimated UV source and mask aligner).

These disadvantages may be avoided using a selective deposition method. In this method, the alignment material is printed, for example using a flexo-printer, pad-printer or ink-jet printer. The printer controls the exact quantity and position of the material to be deposited. However, this method requires that the precise amount of material is deposited and it cannot be used for very fine features.

It is an object of the present invention to mitigate at least some of the above mentioned disadvantages.

Thus according to a first aspect of the invention there is provided a method of providing a patterned layer on a substrate comprising the steps of:
a) applying an adhesion modifier to the substrate;
b) introducing a fixable material between said substrate and a first surface, the first surface being arranged so as to cause the fixable material to adopt a desired configuration; and
c) fixing said fixable material to form a layer of fixed material; wherein the adhesion modifier is applied to the substrate so as to provide at least one first region having an adhesion between the fixed material and the substrate which is greater than the adhesion between the fixed material and the substrate in at least one second region;
and wherein the adhesion modifier, first surface and fixable material are adapted such when the first surface is subsequently removed any fixed material will be removed from said at least one second region and no fixed material will be removed from said at least one first region.

The method of the present invention uses a first surface to form the fixable material into the desired configuration, e.g. thickness, surface profile etc. before fixing the fixable material The method therefore relates to an embossing or casting method for forming a desired layer and thus may involve depositing the fixable material onto the substrate and pressing the first surface towards the substrate so as to cause the fixable material to adopt the desired configuration.

To achieve the patterning of the layer, i.e. to ensure that the patterned layer is only present on desired parts of the substrate, an adhesion modifier is used such that the adhesion between the fixed material and substrate in at least one first region of the substrate is greater than that in at least one second region of the substrate. The properties of the adhesion modifier are adapted to match an appropriate choice of fixable material and first surface such that once the fixable material has been fixed, removal of the first layer automatically removes any fixed material from the at least one second region of the substrate but leaves the fixed material on the substrate in the at least one first region. In other words fixed material in the second region of the substrate adhere preferentially to the first surface and thus are removed when the first surface is removed. The method may further comprises the step of removing said first surface so as to remove said fixed material from the at least one second region. The first surface may be removed as soon or shortly after as the layer has been properly fixed. However, especially where the first surface is art of a disposable layer, the patterned surface may be cut into devices if necessary and/or shipped to a customer before the first surface is removed so as to protect the patterned layer during subsequent processing, storage and/or transport.

This adhesion modifier can be applied as a coating to the substrate and may be applied only in desired areas of the substrate easily by techniques such as printing. As only a thin coating is required the required accuracy can be readily achieved. No mask alignment steps are required and no additional removal steps are needed once the first surface has been removed.

The adhesion modifier may include an adhesion promoter for increasing the adhesion between the first regions of the substrate and the fixed material. In one embodiment the adhesion promoter is selectively applied to the substrate such that the at least one second region comprises any regions where no adhesion promoter is applied.

In one embodiment the properties of the adhesion promoter, fixable material and first surface are chosen such that the first region of the substrate corresponds to regions on the substrate to which the adhesion promoter is applied. In other words the pattern of the coating of adhesion promoter exactly corresponds to the final pattern of the patterned layer.

The method is particularly suitable for creating optical layers for use in liquid crystal devices, e.g. alignment layers, and in such devices the substrate surface may comprise regions of a plurality of different materials. For instance, the substrate may comprise transparent electrodes formed from Indium Tin Oxide (ITO) in certain areas and other areas without such electrodes. There may also be areas of silicon monoxide. The adhesion promoter may be designed to work as an adhesion promoter with any of the substrate surface materials.

In other embodiments however it may be useful to use an adhesion promoter which only acts as an adhesion promoter with one or more of the substrate materials (a first group) and not with one or more of the other substrate materials (a second group). For instance it may be desired to have an alignment structure in areas of the substrate corresponding to the electrode areas which form the pixels but no alignment structure in the gap between pixels. The pixel areas will correspond to, e.g. ITO regions on the substrate whereas the inter-pixel gap may correspond to uncoated glass or plastic. By choosing an adhesion promoter that works with ITO but not glass the desired coverage can be achieved. Thus the first regions of the substrate, having the higher adhesion between the fixed material and the substrate, correspond to those regions of the substrate formed of materials in the first group, e.g. ITO and which are coated in adhesion promoter. The second regions, where removal of the first surface causes removal of the fixed material, comprise not only regions where no adhesion promoter was applied but also regions formed from the second group of materials, e.g. glass or plastic, where adhesion promoter was applied.

The adhesion promoter may therefore comprise at least one active material that adheres more strongly to a material of the first group of materials than any material of the second group of materials.

Whilst an adhesion promoter is currently preferred for providing the desired adhesion properties according to the present invention for making optical layers for LCDs an adhesion demoter or inhibitor could equally well be used. The application of an adhesion inhibitor could involve coating of a material with reduced adhesion properties and/or could involve a passivation treatment to the substrate to reduce adhesion energy densities in the at least one second region of the substrate.

Conveniently the adhesion modifier, first surface and photopolymer are adapted such that the adhesion energy density of the first surface to the fixed material is: higher than the adhesion energy density of the fixed material to the substrate in said at least second region of the substrate, and lower than the adhesion energy density of the fixed material in contact with the substrate in said at least one first region of the substrate.

Conveniently the fixable material comprises photopolymer, for instance a suitable photopolymer bend, and the step of fixing the fixable material comprises exposing said photopolymer to suitable radiation, such as ultraviolet radiation of sufficient intensity, to cure the photopolymer. In such a case the adhesion modifier may be photo-reactive and the step of curing the photopolymer also cases a reaction in the adhesion modifier. The adhesion modifier, e.g. an adhesion modifier, may be activated to chemically bond to the photopolymer.

However the invention is also applicable to other fixable materials such as thermosetting resins, in which case the step of fixing the material may involve heating the thermosetting material.

The first surface could be a flat or regular surface which is used to force the fixable material to adopt a uniform layer of a desired thickness and which acts as a means of removing the fixed material from unwanted areas. However in some embodiments the first surface comprises a surface profile, i.e. a varying surface profile, that is the inverse of a desired surface profile for the fixed material. For instance the surface profile may be an inverse of a desired alignment grating or an optical hologram or refractive layer.

The first surface may be a surface of any suitable apparatus for forming the desired shape. For instance the first surface may be the surface of a transfer layer for embossing into the fixable material. The transfer layer may be part of a shim or stamp or could be a separate layer for pressing into the fixable material. The transfer layer may be flexible and may comprise a carrier film that can be pressed into the fixable material by application of pressure.

In order for the fixable material to flow correctly when embossed the fixable material may be chosen to have a room temperature viscosity below 1000 CP prior to being fixed.

The adhesion modifier may include non fixable groups that act to impart alignment to a contacting liquid crystal. In other words the adhesion modifier may have groups that remain their alignment ability after the fixing step. Any area where adhesion modifier has been deposited on the substrate but fixed material has been subsequently removed may have adhesion modifier as the uppermost layer on the substrate. Using the example described above where adhesion promoter was coated on the inter-pixel gaps but the adhesion promoter was adapted to work only with the ITO areas defining the pixel, the inter-pixel gaps may be left with an uppermost layer of adhesion promoter. By providing groups that provide a desired alignment the alignment of the inter-pixel gaps can be controlled by appropriate choice of adhesion promoter.

In order to achieve the correct adhesion properties the first surface may be treated to reduce its adhesion energy density to the fixed material prior to introducing it to the fixable material. The treatment may comprise treating it with ozone. The treatment may reduce the adhesion energy density of the first surface to the fixed material ($E_{PF}$) to less than 50 J/m$^2$ or less than 10 J/m$^2$. The adhesion energy density of the first surface to the fixed material ($E_{PF}$) following treatment may be greater than 0.1 J/m$^2$ or greater than 2.0 J/m$^2$.

The fixed material may be adapted to have an adhesion energy density to the substrate ($E_{PS}$) in areas devoid of adhesion promoter of less than 10 J/m$^2$ or less than 1.0 J/m$^2$.

The fixed material may be adapted to have an adhesion energy density to substrate coated with the adhesion promoter ($E_{PA}$) of greater than 1.0 J/m$^2$ or greater than 10 J/m$^2$.

Whilst the skilled person will appreciate that the exact range of range of adhesion energy densities will vary depending on the particular application and will be well able to determine the required range of adhesion energy densities for their own application, extensive studies by the inventors have shown that a preferred range of adhesion energy density of the first surface to the fixed material is greater than 3.5 J/m$^2$ and less than 10 J/m$^2$ for a structured polymer material with areas of grating with pitch in the range 0.6 μm to 1.4 μm and height 0.5 μm to 1.4 μm According to a further aspect of the invention, a method of providing for patterning a layer of photopolymer material comprising the steps of:

a) Selectively coating a layer of photo-reactive adhesion promoter onto a substrate surface to create areas coated with a thin layer of photo-reactive adhesion promoter and areas that are devoid of the photo-reactive adhesion promoter;
b) Coating a layer of photopolymer onto said substrate containing regions of photo-reactive adhesion promoter;
c) Exposing the substrate to UV radiation of sufficient energy to cure the photo-polymer and photo-reactive adhesion promoter in said areas coated with photo-reactive adhesion promoter and in said areas devoid of photo-reactive adhesion promoter; and
d) Removing areas of cured photo-polymer from the areas devoid of photo-reactive adhesion promoter.

According to another aspect of the invention, a method is provided for patterning a layer of photopolymer material comprising the steps of:

a) Selectively coating a layer of photo-reactive adhesion promoter onto a substrate surface to create areas coated with a thin layer of photo-reactive adhesion promoter and areas that are devoid of the photo-reactive adhesion promoter;
b) Depositing photopolymer onto said substrate containing regions of photo-reactive adhesion promoter;
c) Taking a carrier film or other carrier medium comprising a surface that will be pressed in contact with the uncured photopolymer, wherein said surface has a higher adhesion energy density to the photopolymer when cured in contact to that photopolymer than the adhesion energy density of the photopolymer in contact with the substrate in regions devoid of photo-reactive adhesion promoter, and wherein the said surface has a lower adhesion energy density to the photopolymer when cured in contact to that photopolymer than the adhesion energy density of the photopolymer in contact with the substrate in regions coated with the photo-reactive adhesion promoter;
d) Embossing the uncured photopolymer by application of pressure between the substrate and the carrier film, such that a uniform layer of photopolymer is formed over the substrate, wherein said embossed layer of photopolymer coats regions coated with photo-reactive adhesion promoter and areas devoid of photo-reactive adhesion promoter;
e) Exposing the substrate containing areas coated with photo-reactive adhesive promoter and areas devoid of photo-reactive adhesion promoter to UV radiation of sufficient energy to cure the photo-polymer and the photo-reactive adhesion promoter; and
d) Removing the carrier layer with such means that the carrier film retains the cured photo-polymer in regions devoid of photo-reactive adhesion promoter, and the substrate retains cured photo-polymer in regions coated with photo-reactive adhesion promoter.

According to a further aspect of the invention, a cell wall for a liquid crystal device comprises an alignment layer for imparting alignment to liquid crystal material, said alignment layer comprising: at least one region comprising a photopolymer layer overlying a layer of photo-reactive adhesion promoter; and at least one region devoid of both photo-polymer and photo-reactive adhesion promoter.

The cell wall may be used as one cell wall in a liquid crystal device having two cell walls enclosing a layer of liquid crystal material; electrode structures on at least one of the internal cell walls; means for distinguishing between switched states of the liquid crystal material; and means for applying suitable electrical signals to cause switching between two or more states of the liquid crystal arrangement.

The cell wall may be made from glass, plastic substrates, metal substrates, semiconductor substrates or other similar material or combination of materials common to the display industry. It is intended that at least one of the substrates of the finished device is transparent, or partly transparent. One of the substrates may be reflective, or absorptive with an internal surface that absorbs part or all of the visible spectrum. One or both substrates may be patterned with areas of different absorbing materials, for example to form colour filters, black matrix layers or similar optical structures. The substrate may also contain additional optical elements such as diffusers, prisms, micro-prisms, lenticular arrays and scattering surfaces. The electrode structures may include row and column electrodes formed from ITO, PEDOT, aluminium, or a combination, or any suitable conducting material. The substrate may include semiconductor elements such as TFT and TFD. The electrodes may be formed as a series of row and column electrodes, they may be arranged in an x-y matrix of addressable elements to form display pixels. Typically these electrodes will be between 100 μm and 300 μm wide, and will be spaced by between 5 μm and 30 μm. Alternatively, the electrodes may be arranged into a segmented format, rθ matrix or other format determined by the information to be spatially modulated. The means for optically distinguishing between the switched state may include one or more polarisers, quarter-wave or similar retardation plates, compensation plates, light sources (CCFL, OLED, LED, filament bulb) and associated light guides.

The liquid crystal may be formed from a nematic, cholesteric or smectic liquid crystal material, including smectic A, smecitc C, chiral smectic C, ferroelectric. The liquid crystal material may be calimitic or discotic. The properties of the liquid crystal material used to electrically switch between the states may be dielectric anisotropy, flexoelectric, ferroelectric, ordoelectric or ionic mobility anisotropy. The device may contain other elements including spacers, polymer walls, glue-seal, end-seal, other particulate electrical a material that includes one or more such phases. The spacing of the glass plates will be between 1 μm and 100 μm, preferably between 3 μm and 8 μm.

One of the alignment layers may be formed from polyimide (rubbed or un-rubbed), surfactant. The photo-polymer used for an alignment layer may be formed into a flat layer wherein it imparts homeotropic, conical or de-generate planar alignment, or it has a subsequent treatment to induced planar alignment such as rubbing. Alternatively, the photo-polymer may be cured by exposure to polarised UV light, whether at normal or oblique incidence, or other method common in the LCD display industry to induce photo-alignment. In these instances, the flat photo-polymer would induce either planar homogeneous or tilted homogeneous, bistable or multistable alignment. The alignment direction may vary within regions of the device such that the in-plane component of the aligned director in at least one of the states varies, but the pretilt is constant, or such that the pretilt varies across the alignment layer.

The use of photo-polymer alignment is particularly advantageous for forming profiled alignment layers. These profiled surface may use the surface features for purposes other than alignment (eg spacers, walls etc) and rely on a separate method of alignment as described above. Preferably, the photo-polymer alignment layer will form a grating to impart alignment dictated by the shape and surface properties of the photopolymer. This grating may be a monograting, a monograting with occasional breaks (eg slips, holes, necks etc), bigratings, pillars, ridges, and other similar structures. The grating may consist of regular, near regular, random or pseudo random features. The grating may be patterned to form areas of different alignment, pitch, latching threshold, switching voltage (eg through change of offset).

The local profile of the grating may be square, rectangular, asymmetric sinusoid, sinsouidal, rhombohedroid or similar, as described in the prior art. Advantageously, the grating may be designed to give bistability or multistability, wherein one or more of the stable states have different aximuthal orientations, or different Zenithal orientations, or a combination of either. Advantageously, the grating will be used to form a Zenithal bistable surface, as described in U.S. Pat. No. 6,249,332 and U.S. Pat. No. 6,456,348.

The invention will now be described by way of example only with reference to the accompanying diagrams of which:

Figure 12:
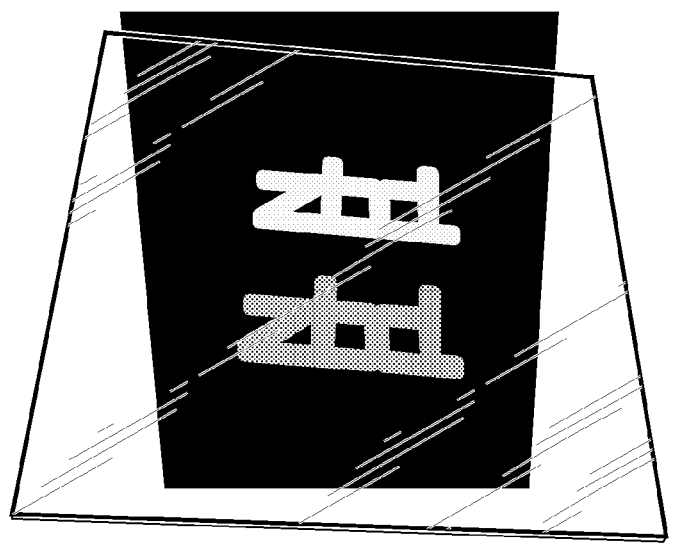
Figure 13:
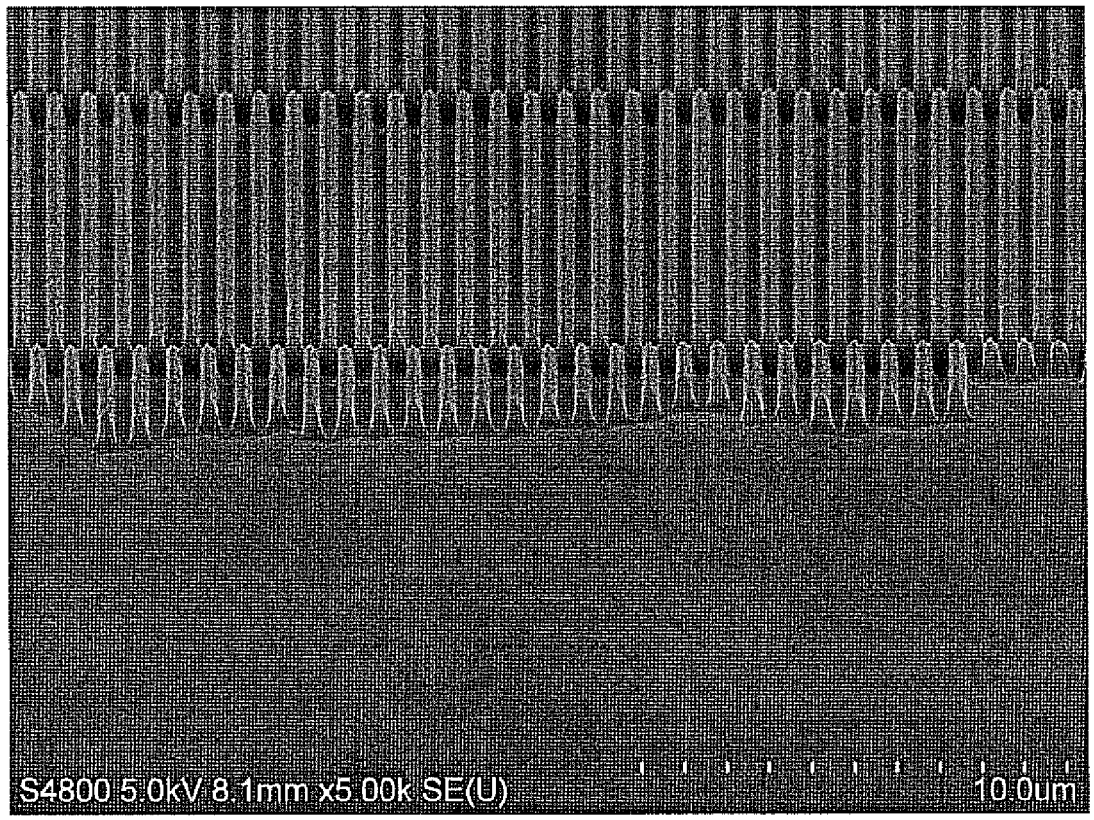

FIG. 12 shows a line drawing of a glass plate patterned according to the present invention to form the inverse structure of a commercial optical film (in this case RCF 90K available from Reflexite limited) on selected areas of the plate; and FIG. 13 shows a SEM photomicrograph of the boundary between areas printed with adhesion promoter onto which the grating adheres, alongside areas in devoid of adhesion promoter, from which the grating has been removed by the film peel step.

Figure 1:
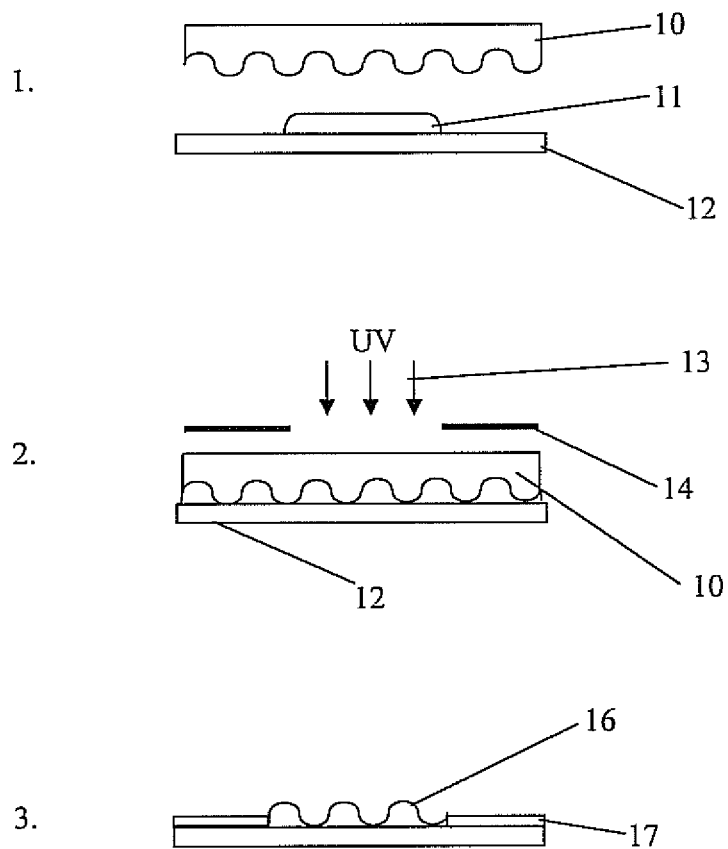
FIG. 1 illustrates the prior art patterning method of selective cure.

FIG. 1 shows a conventional selective cure process for forming a patterned photopolymer layer. In step 1, a puddle of fixable material such as a uncured photopolymer 11 is spread onto LCD substrate 12 prior to lamination of the carrier film 10 which carries the inverse of the desired grating profile. The carrier film is embossed onto the substrate using a vacuum or roller method as described in US2005/0150589. In step 2, the carrier film 10 and LCD substrate laminate 12 is exposed to UV radiation 13 through a contact mask 14. In step 3, the carrier film is peeled away to reveal a region of cured photopolymer 16 which carries the desired grating shape. The dimensions of the cured region are controlled by the design of mask 14 and in practice are chosen to generate regions of gratings which coincide with electrode regions on the LCD substrate. The main problem with the selective cure process is that a layer of uncured photopolymer 17 is also retained on the LCD glass. This has to be removed by additional rinsing and drying steps which adds time and cost to the manufacturing process. In this regard the selective cure process is not ideal.

Figure 2:
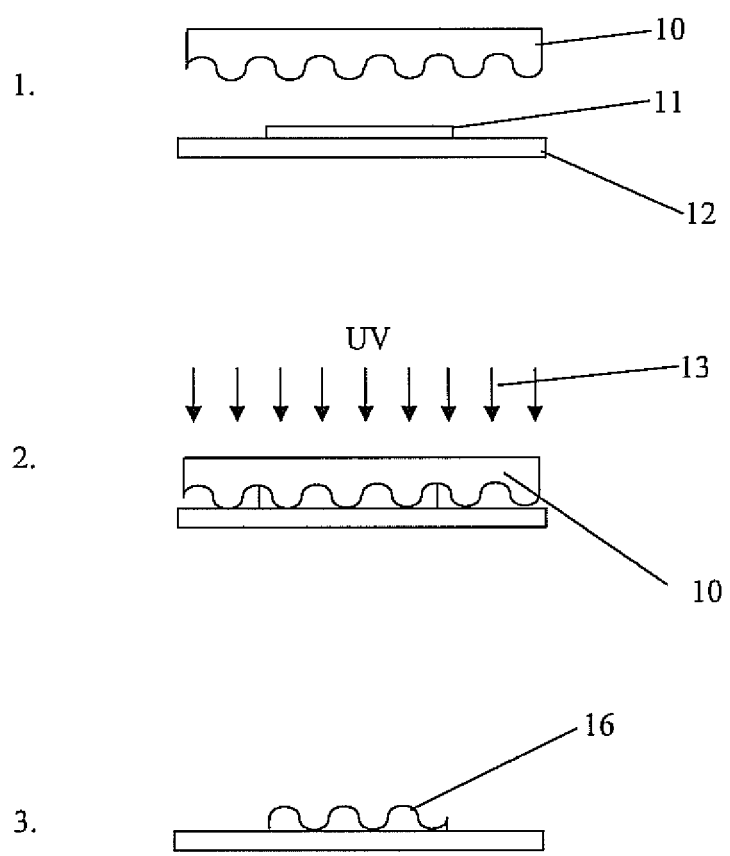
FIG. 2 illustrates the prior art patterning of selective deposition.

FIG. 2 shows the conventional selective deposition process. In step 1, a thin layer of photopolymer 11 is printed onto substrate 12 with precise dimensions and thickness. Inkjet or flexo printing processes can be used to provide this layer. In step 2, the carrier film/LCD substrate laminate contains the layer of photopolymer which still retains the desired dimensions. This laminate is exposed to UV radiation 13 without the need for a contact mask. In step 3, the carrier film is peeled to leave a region of cured grating 16 with clean bare substrate on either side. No further rinse processes are required, hence this selective deposition process is superior to selective curing. However the process requires both precise dosing of the photopolymer as well as tight control of the pressure applied during the embossing process. Any deviation from optimum would lead to either loss of grating fidelity due to incomplete filling of the grating grooves with photopolymer or excess spreading of the photopolymer leading to an error in the size of the cured area.

Figure 3:
FIG. 3 shows a schematic of the selective adhesion method of patterning a photopolymer layer according to the present invention.
Figure 3:
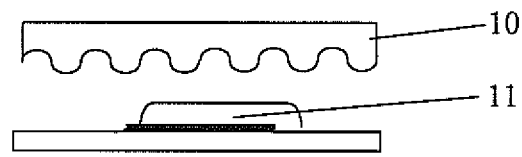
Figure 3:
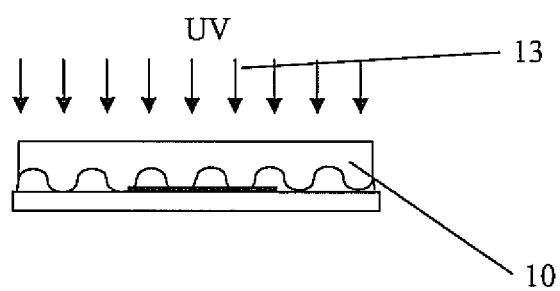
Figure 3:
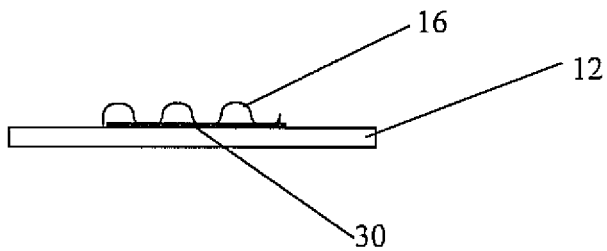

FIG. 3 shows the selective adhesion process according to the present invention. In step 1, a layer of adhesion promoter 30 is printed onto the LCD substrate 12. This layer may be applied using inkjet printing, flexo-printing or other methods. After application the layer can be dried to remove solvents. In step 2, the uncured photopolymer 11 is applied to the LCD substrate on top of areas either with or without the underlying adhesion promoter. This uncured photopolymer may be deposited in a puddle, it may be deposited by spin-coating (either in a solvent which is then evaporated, or as a neat photo-polymer), spray coated, or it may be printed by ink-jet, pad-printer, screen printer or similar method. In all of these cases, the dosage of the photopolymer is non critical. After its application the carrier film 10 is embossed onto the substrate using vacuum or roller processes. In step 3, the carrier film 10 and/or LCD substrate laminate 12 is exposed to UV radiation 13 without the need for any exposure mask. In step 4, the carrier film is peeled to reveal a cured photopolymer region 16 which is adhered to the LCD substrate in the same region which received the photo-active adhesion promoter coating in step 1. The remainder of the cured photopolymer is retained on the carrier film and is thus removed from the surface of the LCD substrate as the film is peeled away from the substrate.

Patent application US2005/0150589 describes methods by which the embossing process can be carried out. In a practical device, the finished grating layer should ideally be limited to the size of the active electrode area or to the viewing area of the display. More importantly the grating should ideally be removed in the vicinity of the LCD edge seal and end plug since these materials are designed to form a strong hermetic seal between glass surfaces (or ITO coated glass surfaces).

It is clear from comparison of the three approaches described, that the selective adhesion method will provide the highest yield and lowest cost method of defining which portions of the substrate retain a grating layer. In this method, neither the adhesion promoter nor the photopolymer need to be applied at a precise dose. Furthermore no rinse processes are required after the carrier film has been peeled from the LCD substrate.

Figure 4:
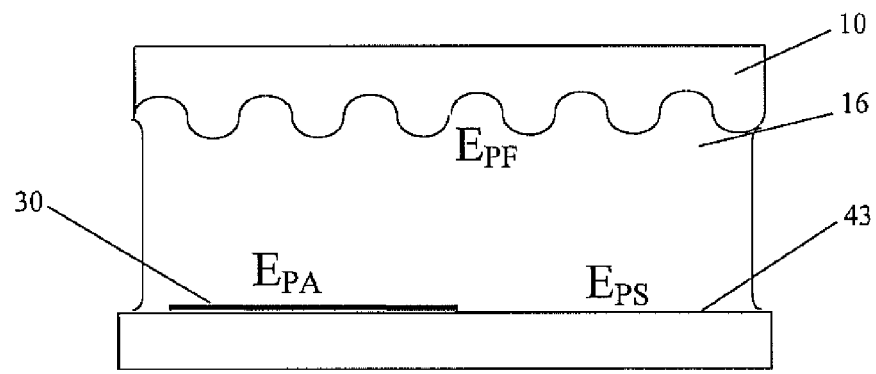
FIG. 4 is a schematic showing the arrangement according to the present invention during or after the embossing process, but before the removal of the film. It includes definition of the important surface adhesion energies.

In order to master the selective adhesion process it is important to be able to control the relevant adhesion energies that exist in the system. These are defined with reference to FIG. 4. The adhesion energy between carrier film 10 and cured photopolymer 16 is referred to as $E_{PF}$. The adhesion energy between cured photopolymer 16 and the regions 43 of the LCD substrate not coated with the photo-reactive adhesion prompter is referred to as $E_{PS}$. The adhesion energy between the cured photopolymer 16 and the LCD substrate coated with the adhesion promoter 30 following the cure of the photopolymer and the reactive adhesion promoter when in contact with each other is referred to as $E_{PA}$. For selective adhesion to be successful the following relationship must be true:

$$E_{PA} > E_{PF} > E_{PS} \tag{1}$$

The present invention provides methods and examples of controlling each of these adhesion energies in order to provide a reliable high yield process.

The adhesion energy between the cured photopolymer and the uncoated LCD substrate ($E_{PS}$) is typically intrinsically low, for example less than 1.0 J/m² since typical photopolymers have little chemical affinity with the inorganic surface of the LCD substrate. However some photopolymer materials contain polar functional groups either by design or as contaminants retained in the compounds that make up the blend. Such polar groups include but are not limited to —COOH, —OH, —CN, —NCS. Such organic end groups will have strong adhesive attraction towards surface groups in the LCD substrate. For example SiOx regions of the substrate will contain surface silanol groups. The areas of the substrate having an ITO coating will also have polar surface terminations. In order to keep the adhesion energy low in such cases the relevant area of the substrate may be passivated through one or more suitable passivation processes to reduce the adhesion energy. For simplicity however it is preferred to select photopolymer compounds for use in the selective adhesion method which have low concentrations of polar groups. The skilled person will be aware of how to choose suitable photopolymer compounds with low concentrations of polar group but one method of determining whether a particular photopolymer blend is suitable is to measure its acid value. Materials with acid values of between 0.2-2.0 mgKOH/g have been found to have suitably low values for $E_{PS}$ while those with acid values of 5-20 mgKOH/g or above are found to be unsuitable in some embodiments of the for selective adhesion method of the present invention.

The adhesion energy between the cured photopolymer and the carrier film ($E_{PF}$) depends partly on the material of the carrier film. The carrier film may itself comprise a cured photopolymer material and, when such film is used, the adhesion energy between the carrier film and the cured photopolymer shaped by the carrier film may be relatively high. As mentioned the surface profile of the carrier film (i.e. the inverse of the desired surface profile) may be formed by coating a layer of photopolymer onto a backing layer such as PET which is cast against a nickel master pattern in a roll to roll or step and repeat fashion. Once cured, the carrier film provides a solid accurate copy of the nickel master. However it is inevitable in any curing system that some percentage of the reactive groups remain unbonded. In the case of free radical polymerisation these groups are acrylate, methacrylate or vinyl ether moieties. These unbonded groups remain available in the carrier film and, when the carrier film is used to impart a predetermined shape to a photopolymer material, may participate in the subsequent curing of the photopolymer material adjacent to the carrier film. This leads to the formation of chemical bonds between the carrier film and photopolymer layer. In such instances $E_{PF}$ is relatively high and is typically un-measurable with peel tests due to sample failure.

One option for reducing the adhesion energy between the carrier film and the photopolymer cured in contact with the carrier film is to form the carrier film using a cationic cure system so that the remaining unreacted groups (epoxide rings) do not participate in a subsequent free radical photopolymer cure. However cationic materials are not favoured for either carrier film or photopolymer blends since these typically have slower curing mechanisms and can lead to unacceptable ionic contamination.

Figure 5:
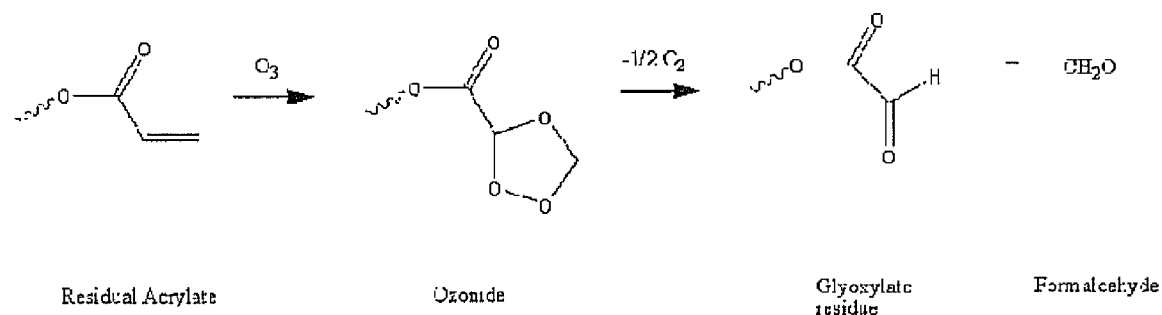
FIG. 5 illustrates an example of a method for lowering the adhesion energy density between the uncured photo-polymer and the carrier film layer by previously exposing the carrier layer to ozone, wherein the contacting surface of the carrier film consists of a pre-formed UV cured photo-polymer.

An alternative strategy for reduction of $E_{PF}$ is to passivate the carrier film prior to use. In this case passivation is associated with conversion of unreacted groups to modified groups which cannot participate in free-radical polymerisation. One suitable method of passivation is to treat the carrier film with ozone prior to using it to pattern the photopolymer on the substrate. Ozone gas may be used to induce the reaction which is shown in FIG. 5. The reaction consists of the electrophilic addition of ozone to ethylenically unsaturated residual groups on the surface of the carrier film. It is probable that, in many cases, the reaction only proceeds to the ozonide stage as the second stage that yields the carbonyl cleavage products often requires catalysis. However, achieving the first stage of the reaction is sufficient since the reactive C=C double bond has already been destroyed at this point. This reaction is general to all compounds containing carbon-carbon double bonds. However, double bonds activated with electron-donating substituents (eg. vinyl ethers, vinyl ester, olefins, etc) are likely to react faster than double bonds deactivated with electron-withdrawing groups, such as methacrylates. The ozone required to effect this reaction may be generated via two principal methods, which are UV-radiation and silent corona discharge. Examples are given below which demonstrate the successful use of ozone passivated carrier film.

Alternatively, the carrier film may be formed using a thermosetting resin on a backing film say into which the required inverse shape has been hot embossed. In such cases, it has been found that release between the thermo-setting resin of the carrier film, and the photopolymer used to coat the glass plate can be achieved without ozone or Corona passivation steps.

Figure 6:
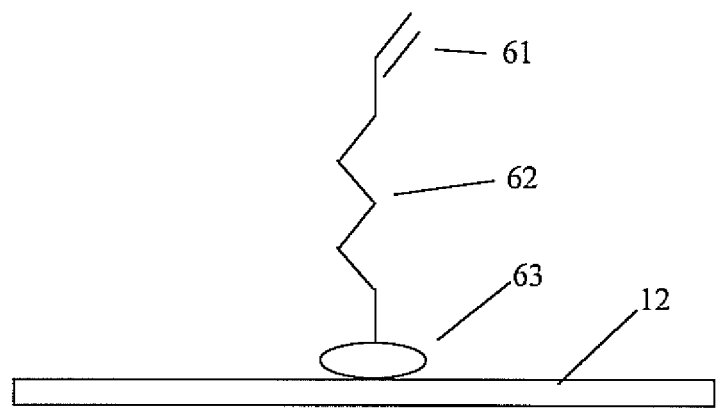
FIG. 6 is a schematic representation of the photo-reactive adhesion promoter molecular arrangement after patterning onto the substrate but before embossing and subsequent photo-induced bonding with the photopolymer wherein a single molecule is represented.

The adhesion energy between the cured photopolymer and the LCD substrate coated with the adhesion promoter ($E_{PA}$) is totally controlled by the choice of adhesion promoter material. FIG. 6 shows the generic structure for an adhesion promoter material. Reactive group 61 is any chemical moiety which can participate in the UV curing of the photopolymer material and thus form chemical bonds with the cured grating layer. This includes acylates, methacrylates, vinyl ethers, epoxides, thiols, or others familiar to those skilled in the art of photofixable materials. Spacer group 62 provides flexibility to the material to improve reaction yield. Reactive group 63 is a moiety which can physisorb or chemisorb onto the surface of the LCD substrate 12. Since the LCD substrate typically consists of areas covered in SiOx or ITO, it best to use a mixture of adhesion promoters in which reactive groups 63 are optimised for bonding to either SiOx or ITO. Tests have found that phosphoric acid moieties adhere well to ITO while silane moieties adhere well to SiOx.

A list of typical adhesion promoters includes but is not limited to:
Ethylene glycol methacrylate phosphate
Vinyl phosphoric acid
Vinyl trimethoxysilane
Triethoxy vinyl silane
3-(trimethoxysilyl)propyl methacrylate
3-(trimethoxysilyl)propyl acrylate Such materials are typically high boiling point compounds which can be applied to the substrate in a highly dilute solution in solvents such as but not limited to:
Ethylene glycol butyl ether
Ethylene Glycol
Propylene glycol
N-Methylpyrrolidone
Ethyl Lactate
1-methoxy-2-propyl-acetate
γ-butyrolactone The adhesion promoter may also be designed to include other components, such as surfactants, that impart properties other than adhesion to the photopolymer. For example, the adhesion promoter may be designed to contain one or more of the following:
alkyl tri-methoxy silane
alkyl tri-methyl silane
alkyl di-methyl chloro silane,
Alkyl tri-chloro silane
Alkyl phosophonic acid None of these groups contain photo-fixable moieties (such as an acrylate group) and will not effect the bonding to the photo-polymer. However, these surfactants will induce (homeotropic) alignment in a contacting liquid crystal material.

The present invention is now demonstrated by the following examples:

First Example

A commercially supplied carrier film containing a grating profile on a 125 micron PET backing layer was passivated by placing the film in a chamber and exposing to an airflow containing 250 ppm of ozone for 10 minutes. Meanwhile LCD glass carrying patterned ITO electrodes was cleaned by ultrasonic washing in detergent solution followed by a double rinse in deionised water. After drying, the substrate was chemically cleaned in a UV ozone chamber. Next the LCD glass was selectively coated in a photo reactive adhesion promoter solution with the following composition:

| Substance | Target amount |
| --- | --- |
| Ethylene glycol methacrylate phosphate | 0.54 g |
| Propylene glycol | 375.0 g |
| Ethylene glycol butyl ether | 60.0 g |
| 3-(trimethoxysilyl)propyl methacrylate | 0.27 g |

This solution was designed to include a reactive adhesion promoter that will attach to the patterned ITO electrodes (EGMP) and a reactive adhesion promoter that attaches to the SiOx regions (such as the interpixel gaps and surrounding electrodes) that were in the viewing area where the grating was required, but which did not have an ITO coating. The solution is completed using volatile solvent designed to give suitable properties for uniform printing, such as the correct viscosity.

This solution was applied to the LCD glass using a flatbed inkjet printer which used a Xaar Omnidot 760 head operating at 45-50° C. The coated wet layer had a thickness of 1.4 microns. After coating, the layer was dried by placing the LCD substrate on a hotplate set to 70° C. for 1 minute followed by a second hotplate set to 130° C. for 5 minutes. After baking the adhesion promoter was invisible to the naked eye due to the very low concentration of the active non-volatile components.

Next a line of photopolymer material was deposited on the LCD glass close to one edge. An example composition of a suitable photopolymers is given below:

| EXAMPLE PHOTOPOLYMER PP2 | |
|---|---|
| Material | Percentage in mix |
| Sartomer SR349 Ethoxylated Bisphenol A Diacrylate | 38% |
| Sartomer SR508 Dipropylene Glycol Diacrylate | 58% |
| Ciba Darocur 1173 photoinitiator | 4% |

This material has a room temperature viscosity of about 200 centiPoise (cp), i.e. 2 Pa. It is advantageous to use a photopolymer with a viscosity of below <1000 cP (20 Pa) when employing an embossing process to form the surface relief structure. This is particularly so for internal structures for an LCD, wherein achieving minimal offset of the structure (i.e. thickness of the embossed layer between the substrate and the lowest part of the embossed structure) on the surface is a key requirement. Use of high viscosity materials leads to a reduction of embossing speed; this may be compensated by increasing the pressure applied, or the shore hardness of the embossing roller used, but practically these risk breaking the glass substrate.

Figure 7:
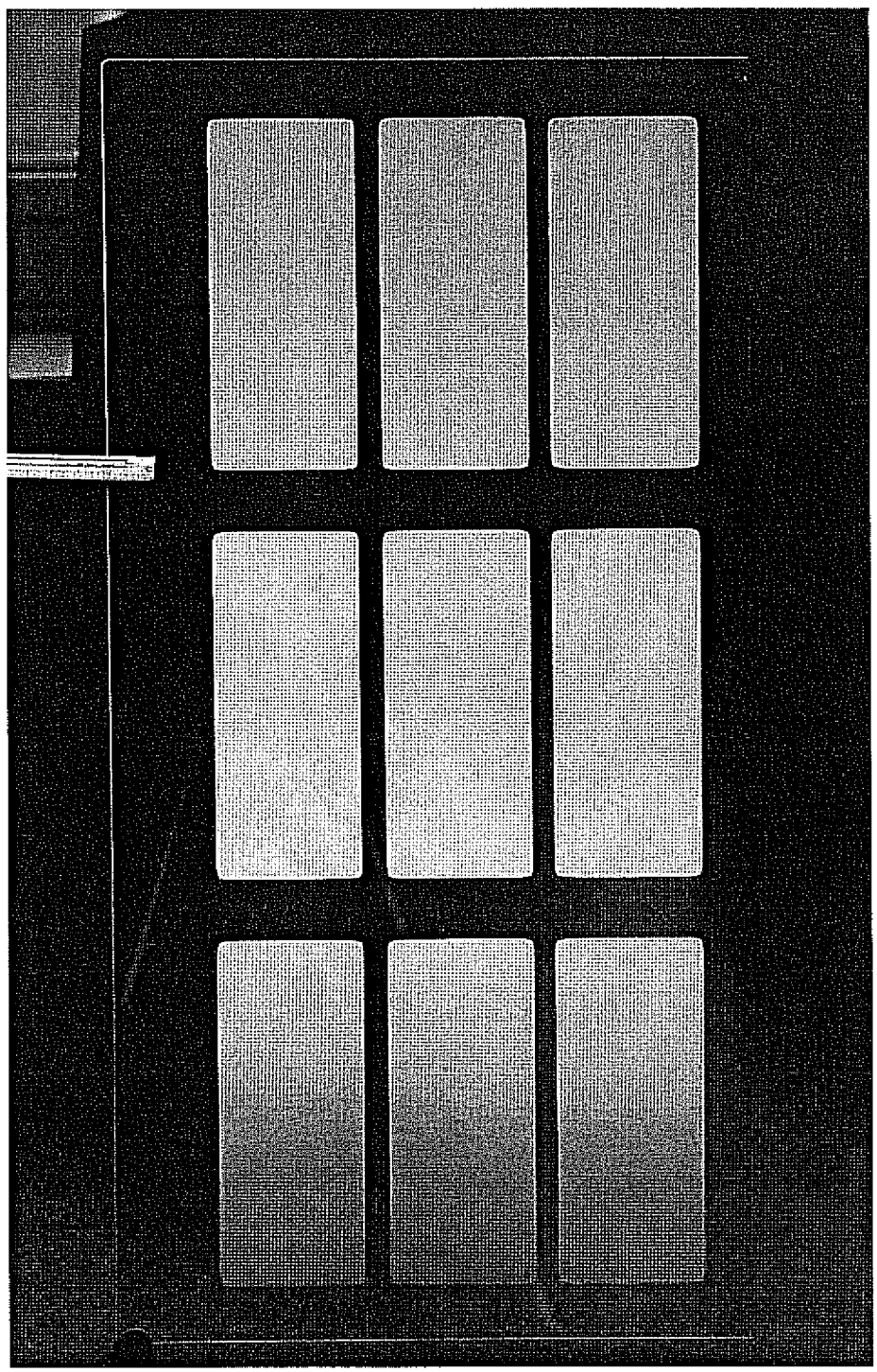
FIG. 7 is a photograph of a plate patterned with 9 separate areas of photo-polymer made according to the present invention.

Carrier film having a grating surface profile such was then laid grating side down on the LCD glass and embossing was carried out using a roller system as described in US2005/0150589 (the contents of which is hereby incorporated by reference). After embossing, the laminate was cured in a UV conveyor with a UVA intensity of 10 mW/cm². The cure time was 120 seconds. Excess photopolymer which had been expelled from between the carrier film and the glass was wiped away with an acetone soaked cloth prior to peeling of the film. After peeling the substrate was observed to carry an array of grating regions whose positions coincided with regions of printed adhesion promoter. FIG. 7 shows a photograph of this sample. The grating regions can be clearly identified by the associated optical diffraction. There were no regions of rogue grating adhesion on the substrate and also no areas of uncured photopolymer or unintended gaps in the grating areas. Thus the selective adhesion process has been successful.

This sample uses a planar aligning photo-polymer. In order to induce Zenithal bistability into such a material, a homeotropic grating alignment condition is desired. This is done simply by subsequently coating the grating material with a long chain silane material. The process used was to rotate the plate constituting the grating in a laminar flow of air into which had been vaporised n-octyl trichlorosilane. This vapour deposits a monolayer of silane onto the photopolymer, which formed a polymerised network of silane groups after baking for 1 hour at 180° C. The density of the silane at the surface is controlled simply be limiting the time of the plates exposure to the silane vapour. Homeotropic alignment results from the effect of the long chain alkyl groups on the contacting liquid crystal. The surface treatment monolayer is readily patterned by a simple shield covering any areas not requiring the silane to be deposited during exposure to the silane vapour.

An SEM image taken at oblique projection of the boundary between the areas coated with the grating, and areas devoid of the grating is given in FIG. 13. In this example there is evidence that there is some small variation in the boundary of the grating. The boundary between area of grating and no grating may vary in practice by up to +/−100 μm. Note, in this example, the grating pitch is 0.8 μm, and the distance between the slips, i.e. the breaks in the continuous grating structure, is approximately 8 μm; the error of the grating deposition is approximately 2 to 4 microns in this example. This may be caused either by the accuracy of the adhesion promoter printing, or may be due to adhesion at the edges of the deposited layer. However, the quality of the boundary is sufficiently good for the purpose of removing the grating from the bonding ledges and glue seal area.

Second Example

A commercially supplied carrier film containing a grating profile on a 125 micron PET backing layer was passivated by placing the film on a conveyer fed ozone chamber. This equipment exposed the grating to an ozone concentration in air of 5000 ppm. The exposure time on the conveyor was set to 2 minutes.

Meanwhile LCD glass was cleaned as described above with respect to the first example. Coating of the adhesion promoter then carried out using a Nakan flexo printer which is usually utilised in LCD production for the printing of polyimide alignment layers. This printer consists of a doctor roller, an analox roller and an APR plate which carried the desired printing pattern. The adhesion promoter (same formulation as the first example described above) was dripped onto the analox roller to form a layer which was controlled in thickness by careful adjustment of the analox to doctor roller separation. At the point of printing the LCD substrate was loaded onto the machine and the adhesion promoter was transferred from the analox roller to the substrate via the patterned APR plate. After coating, the layer was dried by placing the LCD substrate on a hotplate set to 70° C. for 1 minute followed by a oven bake process for 1 hour at 130° C.

After baking of the adhesion promoter, the plate was embossed and cured using a homeotropic photo-polymer with the following composition:

| Substance | Proportion in blend |
|---|---|
| Akzo Nobel Actilane 420 | 66.2 wt % |
| Akzo Nobel Actilane 425 | 28.3 wt. % |
| MBF photoinitiator | 0.5% |
| Octadecylacrylate | 5.0% | in the manner described in US2006/0035086 (the contents of which is hereby incorporated by reference).

Removal of the film automatically revealed an array of grating areas on the LCD substrate similar to those show in FIG. 7.

Third Example

Carrier film was fabricated as follows. A blend of photo-polymers and photo-initiators was mixed with the following constituents:

| Substance | Proportion in blend |
|---|---|
| Cognis Photomer 6210 (di-functional urethane acrylate) | 79.6% |
| 1,6-Hexanediol diacrylate (reactive diluent) | 17.2% |
| Ciba Darocur 1173 (photoiniator) | 3.9% |

After blending, this material was coated as a thick bead onto one edge of a nickel shim which contained an appropriate grating profile. A piece of Melinex 506 PET of 125 microns thickness was placed on top of the nickel and also on top of the bead of photopolymer. The photopolymer was then spread laterally to fill the space between the nickel and the PET using a hand roller. The nickel/photopolymer/PET laminate was the placed on a UV exposure conveyor and exposed to a UVA intensity of 10 mW/cm$^2$ for 4 minutes. The PET was then peeled from the nickel to reveal a solid cured copy of the grating structure.

This film was then passivated as described in the second example above and also embossed, cured and peeled from the LCD substrate in the same manner. Following the film peeling step, the LCD glass was seen to carry an array of grating patterns similar to those shown in FIG. 7.

Fourth Example

Figure 10:
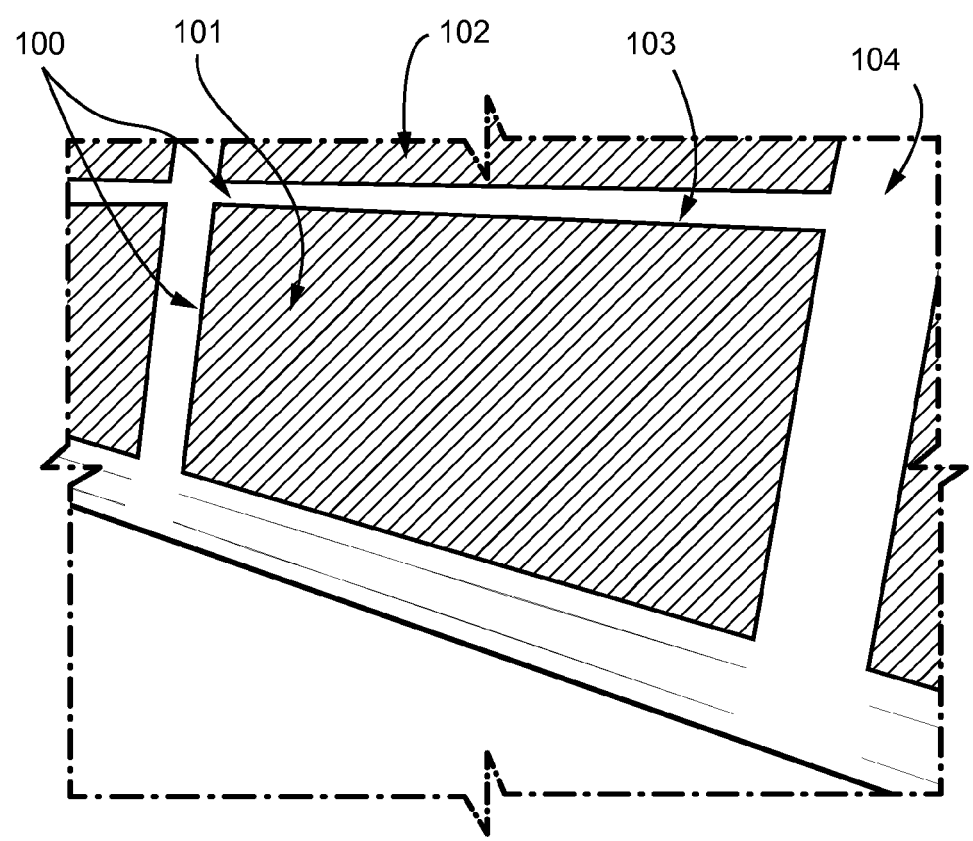
FIG. 10 is a line drawing of a two laminates spaced by 5 μm glass beads, one of which was previously patterned with areas of grating fabricated according to the current invention to form viewing areas of the display, around which there are areas without grating onto which the glue seal that adheres the two laminates to each other has been printed.

A plate constructed in the third example was blow cleaned using CDA and 5 mm spacers blown over the whole area. A second substrate with appropriately patterned rubbed polymide (to induce a 2 deg pre-tilt, and arranged with the rubbing direction parallel to the grating grooves on the first plate) was printed with a thermal glue seal in a pattern that surrounded the grating areas on the first substrate without making contact with those grating areas. The two plates were then brought together facing each and sealed using a heat-press. The resulting laminate of the two plates is shown in FIG. 10. Here the aligned area of one device is defined by the area of grating in the cured photopolymer 101. Other devices from the same laminate are also visible, such as that to have a viewing area defined by the grating deposited over the printed region of reactive adhesion promoter 102. Here the thermal glue seal 103 surrounds most of the grating area 101, except for a small break on the right hand side. This is to allow for subsequent vacuum filling of the liquid crystal material. The substrate comprising the grating photo-alignment layer contains regions of printed grating (101 and 102) but also regions devoid of the photo-active adhesion promoter and hence devoid of grating. These include the areas of the glue seal 103, but also the areas of the bonding ledge 100 and areas between separate devices on the same laminate or the laminate edges 104. The white lines in this figure indicate some of the guide marks that might be used to cut out an individual device from the laminate. The final display is completed by additional scribes to form the bonding ledges, vacuum filling with the appropriate liquid crystal (such as E7) and UV end-sealing the entrance hole for the liquid crystal.

Figure 11:
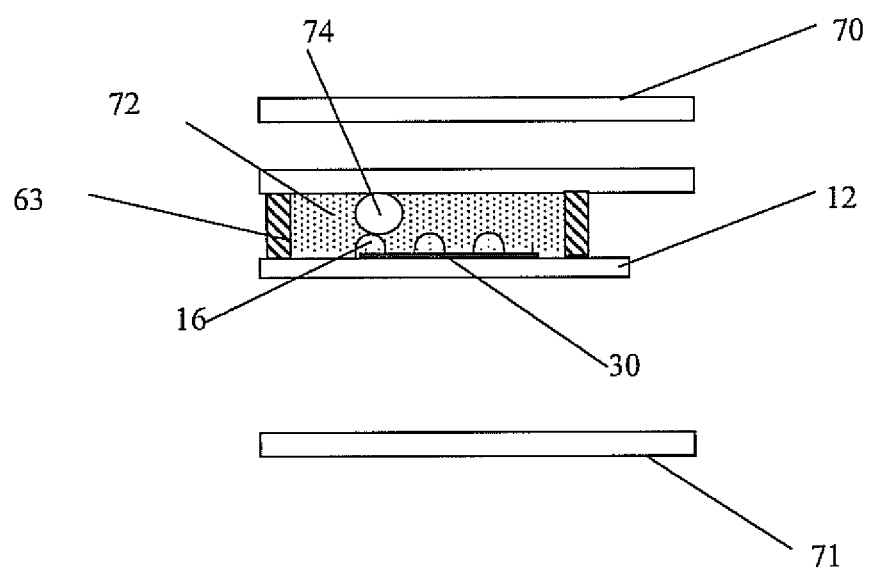
FIG. 11 shows a schematic cross-section of a device according to the current invention.

A schematic cross section of the device is shown in FIG. 11. The device comprises glass spacers 74, a transmitting polariser 71 and a reflecting polariser 70. The device is filled with a liquid crystal material 72.

Before use, the display was heated to a temperature (80° C. in this example) that gave isotropic phase to the liquid crystal and subsequently cooled down to operating temperature. In this case, the liquid crystal nematic material cooled into one of the two Zenithal bistable states. This state was the D (defect) state and the cell had been arranged so that this state was a twisted nematic configuration (because the polyimide rubbing direction and grating grooves were parallel). Because the grating area extended over the whole of the viewing area, the initial state was uniform. After testing for cosmetic and electro-optic behaviour, the cell is bonded to appropriate electronic drivers, and, as mentioned above, mounted with a transmitting polariser 71 on the front substrate (the one containing the grating layer) and a reflecting polariser 70 on the rear. In this instance the polarisers were arranged to be perpendicular to each other. This meant that the initial state of the whole viewing area appeared reflective or "white". This gave a pleasing appearance to the display, offering a high brightness, as is advantageous.

Fifth Example

Commercial carrier film was passivated as described in the second example. A flexo printer was primed with an alternative adhesion promoter with the following composition:

| Substance | Target amount |
|---|---|
| Ethylene glycol methacrylate phosphate | 0.54 g |
| Propylene glycol | 375.0 g |
| Ethylene glycol butyl ether | 60.0 g |

This is similar to the formulation described with reference to the first example except that the silane adhesion promoter is omitted. This mix was then printed onto glass and baked as described in the second example except that the final oven bake temperature was set to 170° C. After baking, the substrate was embossed using the passivated film and cured followed by peeling of the film.

Figure 8:
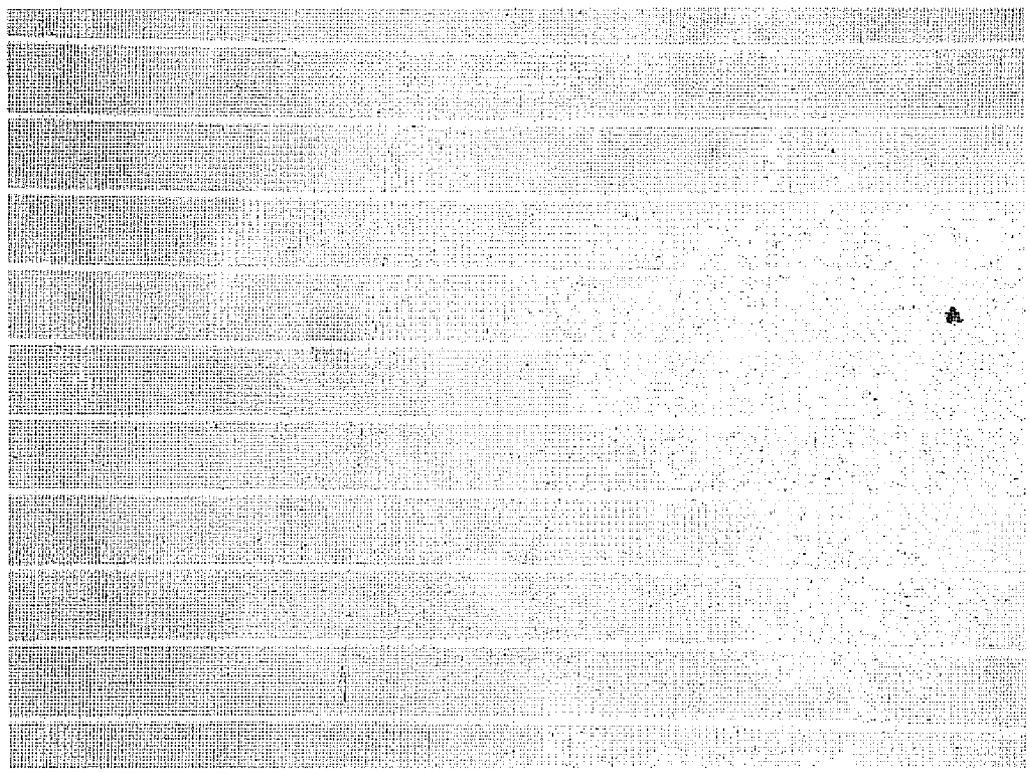
FIG. 8 is a close up photograph of a device patterned according to one aspect of the present invention where the patterning is dictated by a combination of both the patterning of the reactive adhesion promoter and the prior pattering of the ITO electrodes.
Figure 9:
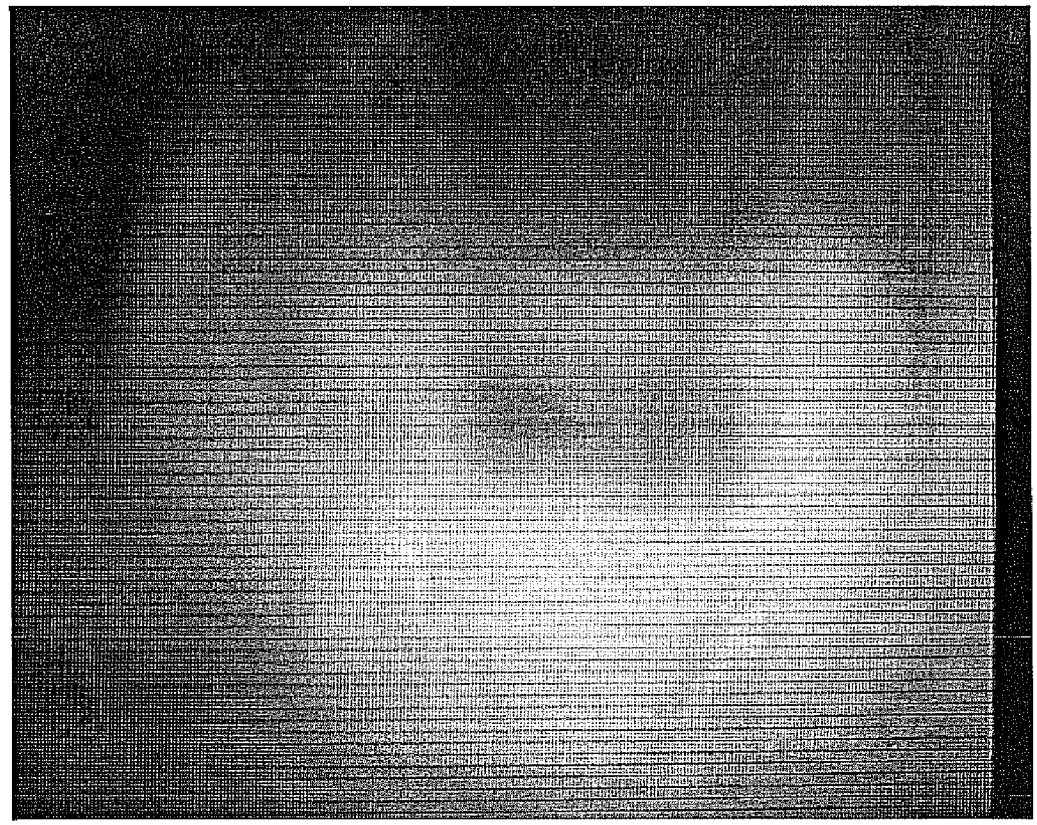
FIG. 9 shows the whole grating area of the substrate pattered and shown in FIG. 8.

The substrate was observed to carry an array of grating patterns. Microscopic observation within these grating areas (FIG. 8) shows that the grating layer is missing from the LCD substrate in thin horizontal strips. FIG. 9 shows a camera image of a larger area and demonstrates that the effect persists across the entire grating area. These horizontal strips correspond to inter-pixel gaps which are regions of the LCD substrate in which the ITO coating has been removed to reveal the under-laying SiOx barrier layer. The adhesion promoter used in this example did not contain a silane active ingredient leaving only the phosphate material. The phosphate forms a very strong physisorbed layer on ITO but has relatively poor adhesion to SiOx. The higher temperature baking process has the effect of evaporating the phosphate from the SiOx regions of the substrate whereas the phosphate on the ITO regions remains unaffected. This effect also occurs at lower bake temperatures hence the adhesion promoter in the first example also contained a silane active ingredient which forms a chemisorbed layer in SiOx and boosts the adhesion in these regions of the substrate.

Thus the careful choice of adhesion promoter material and processing conditions is effective in further selecting which areas of the substrate retain a grating structure. This selection is based on the surface material of the substrate and allows patterning on scale lengths below those available via either inkjet or flexo printing methods.

A display of this substrate was then fabricated using the same method as that described with reference to the fourth example. However in this case the grating was devoid from the inter-pixel gaps of the device. Thus, when the device was first cooled, the interpixel gap areas gave an approximately planar orientation rather than the twisted nematic, whereas the pixel areas (where the adhesion promoter had been retained after the solvent drying and baking steps) had grating, and hence cooled into the D state (thereby forming areas of twisted nematic). When viewed between parallel polarisers, this device then gave white inter-pixel gaps This was advantageous since the optical configuration of the normally black mode TN (twisted nematic) device gives an improved white balance. However, if the interpixel gap (IPG) areas had remained black, then the reflectivity would be compromised. In this method, the pixels were NB mode, whereas the IPG regions remained white, thereby combining a high reflectivity and contrast ratio with a good white balance.

This example allows the grating to be patterned using both areas devoid of the adhesion promoter in the initial printing step, and also from areas onto which the adhesion promoter may have been printed, but which are devoid of the ITO or other transparent conductor (patterned in an earlier production step). In addition to the NB device given above, this approach has other advantages. For example, the alignment layer can be formed from a uniform mono-grating structure in the carrier film that is without any breaks, i.e. breaks in the grating continuity along the groove direction such as slips (relative phase shifts of the grating profile), holes, etc. described in WO2004/070465A1. If the grating is then deposited so that the grooves run parallel to the underlying electrodes (for an xy matrix display) then spontaneous breaks are formed at each interpixel gap after the carrier film is peeled away. That is, the grating breaks may be formed using the selective adhesion process during the display processing steps, rather than pre-designing suitable breaks into the original master grating. This prevents problems associated with Moire patterning of the interpixel gaps (where slips repeat near to a multiple of the pixel pitch). It also allows simpler mastering methods to be employed, such as interferographic gratings, in which the slip structure is difficult to pre-define.

Sixth Example

The selective adhesion method does not need to be employed for LCD alignment layers only. There are a number of commercially available optical films from companies including Avery Dennison, Kurz, MacDermid Autotype, Microsharp, Optaglio, Reflexite and 3M that make optical structures such as diffusers, moth-eyes, micro-prisms, corner reflectors and holographic elements. These structures may be formed using either thermally setting polymers and photopolymers; these structures may also receive subsequent coatings, such as metallization. Such structures may either be used externally on or internally to an LCD. It may be advantageous to pattern such structures. For example, anti-reflection coatings could be used selectively for some areas of a pixel and not others. Internal reflectors or prism structures could be positioned to lie within the interpixel gaps only etc.

An example of selective adhesion being used to pattern a glass plate with the inverse of a commercially available optical film (RCF 90K, available from Reflexite) is shown in FIG. 12. In this instance, the method described in the first example was employed, since the film was found to require some passivation to give good release without damage to the optical structure.

Seventh Example

In a similar fashion to the sixth example, a commercially available metallised optical foil comprising a holographic relief structure (SB Spotlite from Kurz Limited) was patterned onto the internal surface of an LCD device. Such a method may be used to provide a simple, high volume manufacturing method for Multiple Access Computer-Generated Hologram described in U.S. Pat. No. 6,043,910. The method described with reference to the first example was followed to copy the inverse of the holographic structure onto an ITO coated plate into the photopolymer. In this example, it was also found that selective adhesion was possible even without pre-passivating the holographic foil with ozone. Once coated and patterned, the photopolymer PP2 was subsequently coated in tri-chloro octyl silane by passing through a low humidity chamber containing the vapour phase of this surfactant for a controlled period and silane dose. After baking the substrate at 180° C. for one hour, the substrate was coated with a uniform monolayer of the silane surfactant; this coating extended to both the areas with the inverse of the holographic structure, and the areas in which the glass was free from the photopolymer due to selective adhesion patterning process. This substrate was then used to form an LCD opposite a second ITO coated glass plate, coated with the homeotropic alignment polymer SE1211 from Nissan Chemicals. A 10 μm cell was constructed and filled with a dielectrically negative nematic liquid crystal, and put between crossed polarisers.

The cell was found to have a homeotropic alignment to the liquid crystal over the patterned areas and the unpatterned areas at the edge of the device close to the glue seal. The relief structures were less than 0.2 μm high, and so only a monostable continuous alignment state was formed. The areas comprising the holographic relief structure of the photopolymer were almost optically inactive, since the liquid crystal material showed very little retardation because the refractive index of the photopolymer and the ordinary refractive index of the liquid crystal were nearly matched. However, application of an electric field over the whole device caused the liquid crystal to switch towards the plane of the cell. The holographic pattern then became visible as the alignment of the liquid crystal director varied due to the pattern of the relief structure, and also because of the refractive index mismatch between the photopolymer and the extraordinary index of the liquid crystal.

Eighth Example

The adhesion-promoter with the following composition

| Substance | Target amount |
|---|---|
| Ethylene glycol methacrylate phosphate | 0.125% |
| Propylene glycol | 86.045% |
| Ethylene glycol monobutyl ether | 13.767% |
| 3-(trimethoxysilyl)propyl methacrylate | 0.063% | was printed onto ITO-patterned glass in well-defined areas. These areas define the regions in which the aligning photopolymer grating is intended to adhere to the substrate and, hence, confer alignment in the contacting liquid-crystal in the finished LCD device. Several methods for printing the said adhesion-promoter were employed with equal success. One method involved offset-printing using an APR-plate with product-specific raised areas that impart the intended pattern on the ITO-glass substrate. Another method involved the use of an ink jet printing device whereby the same adhesion promoter is jetted directly onto the ITO-glass substrate in the desired pattern. The wet film, once printed onto the glass using either of the aforementioned techniques, is dried to remove the carrying solvent and fix the active components to ITO-glass substrate. This is achieved by heating the patterned ITO-glass plates in a controlled manner using hotplate(s) and/or HEPA-ovens. The drying/fixing temperature range was between 40° C. and 200° C., preferably between 50° C. and 180° C. and most preferably between 60° C. and 150° C.

Ninth Example

The following adhesion promoter composition was printed onto ITO-glass substrate and subsequently dried and fixed in identical ways to those outlined for the adhesion promoter composition of example 8.

| Substance | Target amount |
| --- | --- |
| Phosphoric acid, 2-hydroxyethyl methacrylate esters | 0.062% |
| Propylene glycol | 85.935% |
| Ethylene glycol monobutyl ether | 13.75% |
| 3-(trimethoxysilyl)propyl methacrylate | 0.253% |

Tenth Example

The following lacquer was formulated

| Substance | Target amount |
| --- | --- |
| Photomer ® 6210 | 63% |
| Sartomer SR238B | 16% |
| Sartomer CN9170 | 15.0% |
| Photomer ® 4006F | 2.0% |
| Genocure ® LTM | 4.0% | and used to replicate a bistable grating shape by embossing it between a sheet of patterned nickel and a sheet of ink-receptive poly(ethylene terephthalate). The laminate thus formed was then photo-cured to harden the resin and form a durable structure. The curing process was carried out by exposing the laminate to a non-collimated ultraviolet light-source with a strong peak at 365 nm, such as a medium-pressure mercury lamp, or similar methods well-known to those familiar in the art. Processing parameters, such as resin thickness, curing-temperature, UV-exposure (intensity and time) can be optimised to yield film with the desired mechanical properties, such as compressibility, shear modulus and flexibility. The lacquer composition was embossed to give a 5 micron thick wet-layer and cured using 100 mW/cm$^2$ average output power-density with 30 seconds total exposure time. This gave a film with relatively high flexibility and compressibility and low shear-modulus.

Eleventh Example

The following lacquer was formulated:

| Substance | Target amount |
| --- | --- |
| Photomer ® 6210 | 65% |
| Sartomer SR238B | 14% |
| Sartomer CD9021 | 15.0% |
| Photomer ® 4006F | 2.0% |
| Genocure ® LTM | 4.0% | was used to emboss a bistable grating shape in the same way as described in example 10. This film was found to give improved compressibility, and could produce surface features with high aspect ratios (eg. 1.1 µm high gratings with pitch of 0.8 µm) whilst being embossed at pressures in excess of 5 bar (with shore hardness of 805 and 5 cm radius rollers).

Twelfth Example

The film prepared from example 10 was used in conjunction with ITO-glass plates prepared from example 5 (patterned with adhesion-promoter composition of example 8). A blend of monofunctional and multifunctional (meth)acrylate ester monomers and a photoinitiator were dispensed onto the ITO-glass substrate (substrate pre-prepared per example 8) in a thin line along one side of the 'active area' and the film (film pre-prepared per example 10) placed, grating-side down, on top of the line of photopolymer and covering the 'active area'. This laminate was then embossed, allowing the nip of the photo-monomer/photoinitiator blend to spread over the entire 'active area', by passing the laminate through two rollers with pre-determined shore-hardness and at a prescribed pressure and speed. The Shore-hardness employed was between 20 and 100 (Shore A), preferably between 40 Shore A and 90 Shore A, most preferably between 50 Shore A and 80 Shore A. The pressure employed was between 0.5 Bar and 10.0 Bar, preferably between 1.0 Bar and 6.0 Bar, most preferably between 1.5 Bar and 5.0 Bar. The speed employed was between 10 cm/min and 99 cm/min, preferably between 20 cm/min and 80 cm/min and most preferably between 30 cm/min and 70 cm/min. The resulting 'wet laminate' was then cured by exposing to non-collimated ultraviolet radiation for 120 seconds at a power-density of 8-10 mW/cm$^2$ in order to harden the embossed (meth)acrylate monomer/photoinitiator blend ('embossed photopolymer'). An attempt to peel the transfer (carrier) film from the cured laminate did not give the desired result due to excessive adhesion between the film, the cured embossed photopolymer and the region of the ITO-glass which had received the adhesion-promoter. Attempts to force the peel of the film resulted in tearing of the transfer film and severe damage to the underlying grating structure.

Thirteenth Example

The procedure outlined in example 12 was repeated but with one important difference. Before the transfer (carrier) film was used to construct the 'wet-laminate' it was treated by exposing it to ozone at a concentration of 2500-3000 ppm for 3 minutes, in accordance with one aspect of the current invention. After curing in the same way as that outlined in example 12, the transfer-film was successfully peeled from the cured laminate. In this case, the 'embossed photopolymer' adhered to the ITO-glass in the regions which had been treated with the adhesion promoter and adhered to the transfer-film in the regions which had not been treated with the adhesion promoter. The result was a perfect, undamaged, faithfully-replicated photopolymer grating structure on the areas of the ITO-glass which had been pre-defined by the adhesion-promoter printing-pattern. The adhesion energy between the ozone-passivated transfer-film and the embossed photopolymer was measured and found to be 5.1 J·m$^{-2}$.

Fourteenth Example

The film prepared from example 11 was used in conjunction with ITO-glass plates prepared from example 8. Before the transfer-film was used to construct the 'wet-laminate' it was treated by exposing it to ozone at a concentration of 2500-3000 ppm for 3 minutes. A blend of monofunctional and multifunctional (meth)acrylate ester monomers and a photoinitiator were dispensed onto the ITO-glass substrate (substrate pre-prepared per example 8) in a thin line along one side of the 'active area' and the film (film pre-prepared per example 11) placed, grating-side down, on top of the line of photopolymer and covering the 'active area'. This laminate was then embossed, allowing the nip of the photomonomer/photoinitiator blend to spread over the entire 'active area', by passing the laminate through two rollers with pre-determined shore-hardness and at a prescribed pressure and speed. The hardness of the rollers employed was 70 (Shore A). The pressure employed was 4.0 Bar. The speed employed was 50 cm/min. The resulting 'wet laminate' was then cured by exposing to non-collimated ultraviolet radiation for 120 seconds at a power-density of 8-10 mW/cm² in order to harden the embossed (meth)acrylate monomer/photoinitiator blend ('embossed photopolymer'). An attempt to peel the transfer film from the cured laminate did not give the desired result due to insufficient adhesion-energy between the ozone-passivated transfer-film and the embossed photopolymer. The result was an undamaged photopolymer grating which adhered to the ITO-glass but extended beyond the areas that had been pre-defined by adhesion-promoter printing pattern. The adhesion energy density between the ozone passivated transfer-film and the embossed photopolymer was measured and found to be 3.1 Jm$^{-2}$.

Fifteenth Example

The procedure outlined in example 14 was repeated except for one important difference. In this case film prepared from example 11 was used in conjunction with ITO-plates prepared from example 9. The result was a perfect, undamaged, faithfully-replicated photopolymer grating structure on the regions of the ITO-glass which had been pre-defined by the adhesion-promoter printing-pattern with no spreading of the embossed grating beyond these areas.

Sixteenth Example

The procedure outlined in example 13 was repeated but with a different ozone-treatment applied to the transfer-film. In this case, the film was treated by exposing it to ozone at a concentration of 500-700 ppm for 10 minutes. The result was a perfect, undamaged, faithfully-replicated photopolymer grating structure on the areas of the ITO-glass which had been pre-defined by the adhesion-promoter printing-pattern and the adhesion energy between the ozone-passivated transfer-film and the embossed photopolymer was similar.

Seventeenth Example

The procedure outlined in example 13 was repeated but with a different ozone-treatment applied to the transfer-film. In this case, the film was treated by exposing it to ozone at a concentration of 500-700 ppm for 15 seconds. The result was a damaged photopolymer grating on the regions of the ITO-glass which had been pre-defined by the adhesion-promoter printing-pattern with no spreading of the embossed grating beyond these areas. Microscopic examination revealed damage to individual grating grooves and that this sparse damage was distributed over the entire embossed area. The adhesion energy between the ozone-passivated transfer-film and the embossed photopolymer was palpably high.

Eighteenth Example

The procedure outlined in example 13 was repeated but with a slightly different film-passivation method employed. In this case, the ozone was generated from a corona-discharge apparatus placed in close proximity to the film. This was found to give similar results to those achieved in example 13 within certain process limits of power-density and exposure-time.

Nineteenth Example

The procedure outlined in example 13 was repeated but with a different film-passivation method employed. In this case, a gaseous secondary amine was used as the passivating agent. The film was treated with 500 mbar partial pressure of dimethylamine for 30 minutes. This gave similar results to the method used in example 13.

Twentieth Example

The ITO-glass patterned with a photopolymer grating structure with precisely-controlled dimensions outlined in example 13 was forward-processed into a zenithal bistable liquid crystal device by laminating it against a rubbed-polyimide counter-electrode plate, sealed with epoxy-based thermal glue. The resulting cell was filled with a liquid crystal mixture and annealed above the clearing point of that liquid crystal for a prescribed length of time. The resulting device gave superior electro-optic performance and accelerated-lifetime study results.

Twenty-First Example

The ITO-glass patterned with a photopolymer grating structure with precisely-controlled dimensions outlined in example 14 was forward-processed into a zenithal bistable liquid crystal device by laminating it against a rubbed-polyimide counter-electrode plate, sealed with epoxy-based thermal glue. The resulting cell was filled with a liquid crystal mixture and annealed above the clearing point of that liquid crystal for a prescribed length of time. The resulting device gave inferior electro-optic performance and performed poorly in accelerated-lifetime studies.

Twenty Second Example

Example 5 uses an adhesion promoter containing only acrylate phosphonic acid components, and no photo-fixable silane groups. The phosphonic acid bonds predominantly to the ITO coated regions of the glass, and not to bare glass or SiOx barrier layer. When the film is peeled from the embossed and cured plate, the grating is stripped from the inter-pixel gap areas, since these areas were spontaneously devoid of the adhesion promoter. An improved version of example 5 was made in exactly the same way, but instead using the adhesion promoter:

| Substance | Target amount |
| --- | --- |
| Ethylene glycol methacrylate phosphate (EGMP) | 0.54 g |
| Octyltrimethoxysilane | 0.1 g |
| Propylene glycol | 375.0 g |
| Ethylene glycol butyl ether | 60.0 g |

The low concentration of the octyltri-methoxy silane in the adhesion promoter did not disrupt the adhesion between the EGMP and the PP2 photopolymer in the pixel areas. However, in the inter-pixel gaps, the octyl-tri-methoxy silane did bond to the SiOx barrier layer. After the grating was stripped away from the interpixel gaps, the silane present in these regions then served to give homeotropic alignment of the contacting liquid crystal. This meant the uniformity of the sample is improved. Note, in this example, the grating was more reliably stripped from the IPG due to the low surface energy that the silane presents of the contacting photopolymer at that stage of the process.

The invention claimed is:

1. A method of providing a patterned layer on a substrate comprising the steps of:
    a) applying an adhesion modifier to the substrate;
    b) introducing a fixable material between said substrate and a first surface, the first surface is configured to cause the fixable material to adopt a desired configuration and said fixable material comprising a photopolymer; and
    c) fixing said fixable material to form a layer of fixed material by exposing said fixable material with radiation;
    wherein said applying step includes applying the adhesion modifier to the substrate so as to provide at least one first region having an adhesion between the fixed material and the substrate which is greater than the adhesion between the fixed material and the substrate in at least one second region;
    and wherein the adhesion modifier, first surface and fixable material are configured such that, when the first surface is subsequently removed, any fixed material will be removed from said at least one second region and no fixed material will be removed from said at least one first region; and
    wherein the fixing step causes the adhesion modifier to react and to chemically bond to the photopolymer.

2. A method as claimed in claim 1 wherein the method further comprises the step of removing said first surface so as to remove said fixed material from said at least one second region.

3. A method as claimed in claim 1 wherein said adhesion modifier comprises an adhesion promoter for increasing the adhesion between the at least one first region of the substrate and the fixed material.

4. A method as claimed in claim 3 wherein said adhesion promoter is selectively applied to the substrate and wherein said at least one second region comprises any regions where no adhesion promoter is applied.

5. A method as claimed in claim 3 wherein the substrate surface comprises at least two different materials and the adhesion promoter is adapted to improve the adhesion between the fixed material and each of the at least two different materials of the substrate surface such that said at least one first region comprises any regions where the adhesion promoter has been applied.

6. A method as claimed in claim 3 wherein the substrate comprises a plurality of materials and wherein the adhesion promoter is configured to:
    act as an adhesion promoter for one or more of the substrate materials forming a first group; and
    substantially not act as an adhesion promoter for one or more of the substrate materials forming a second group, wherein said at least one first region of the substrate comprises any regions of the substrate formed from a material of the first group of materials to which the adhesion promoter has been applied and said at least one second region of the substrate comprises any region of the substrate to which no adhesion promoter has been applied and also comprises any regions of the substrate formed from a material of the second group of materials to which the adhesion promoter has been applied.

7. A method as claimed in claim 6 wherein the adhesion promoter comprises at least one active material that adheres more strongly to a material of the first group of materials than any material of the second group of materials.

8. A method according to claim 3, wherein the fixed material is adapted to have an adhesion energy density to the substrate ($E_{PS}$) in areas devoid of adhesion promoter of less than 1.0 J/m$^2$.

9. A method according to claim 3, wherein the fixed material is adapted to have an adhesion energy density to substrate coated with the adhesion promoter ($E_{PA}$) of greater than 1.0 J/m$^2$.

10. A method as claimed in claim 1 wherein the adhesion modifier, first surface and fixable material are configured such that the adhesion energy density of the first surface to the fixed material is:
    higher than the adhesion energy density of the fixed material to the substrate in said at least one second region of the substrate, and
    lower than the adhesion energy density of the fixed material in contact with the substrate in said at least one first region of the substrate.

11. A method as claimed in claim 1 wherein the step of introducing the fixable material between the substrate and the first surface comprises the steps of:
    depositing the fixable material onto the substrate; and
    pressing the first surface towards the substrate causing the fixable material to adopt the desired configuration.

12. A method as claimed in claim 1 wherein the substrate comprises one of glass or plastic and wherein the substrate surface may have regions coated in one or more of Indium Tin Oxide and silicon monoxide.

13. A method as claimed in claim 1 wherein the first surface comprises a surface of a transfer layer for embossing into the fixable material and wherein the transfer layer comprises a flexible carrier film.

14. A method according to claim 1 wherein the adhesion modifier includes non fixable groups that impart alignment to a contacting liquid crystal.

15. A method according to claim 1 wherein the fixable material has a room temperature viscosity below 1000 cP prior to being fixed.

16. A method according to claim 1 further comprising the step of treating the first surface to reduce its adhesion energy density to the fixed material prior to introducing it to the fixable material.

17. A method as claimed in claim 16, wherein the step of treating the first surface comprises treating it with ozone.

18. A method as claimed in claim 16, wherein the first surface is treated in order to reduce its adhesion energy density to the fixed material ($E_{PF}$) to less than 10 J/m$^2$.

19. A method according to claim 1, wherein the adhesion energy density of the first surface to the fixed material is greater than 3.5 J/m$^2$ and less than 10 J/m$^2$ and wherein the first surface contains a structured polymer material with areas of grating with pitch in the range 0.6 μm to 1.4 μm and height in the range of 0.5 μm to 1.4 μm.

20. A method of embossing a layer of fixable material with a required surface profile in selected regions of a substrate, said method comprising the steps of:
    a) printing a layer of adhesion promoter in said selected regions on the substrate;
    b) providing a carrier film having an inverse of the required surface profile formed on one side thereof;
    c) coating the substrate with a layer of fixable material, said fixable material comprising a photopolymer;
    d) laminating the carrier film and the substrate, wherein the carrier film causes the required surface profile to be formed in the layer of fixable material;

e) fixing the fixable material by exposing the fixable material to radiation and chemically bonding the adhesion promoter to said photopolymer; and f) removing the carrier film from the fixable material, wherein after removal of the carrier film the substrate is coated with grating regions which are limited to those areas having received the adhesion promoter.

\* \* \* \* \*